United States Patent [19]

Brown

[11] Patent Number: 4,494,019

[45] Date of Patent: Jan. 15, 1985

[54] LOW LEVEL SIGNAL COMPARATOR APPARATUS

[75] Inventor: James L. Brown, Toddville, Iowa

[73] Assignee: Rockwell International Corporation, El Segundo, Calif.

[21] Appl. No.: 409,373

[22] Filed: Aug. 18, 1982

[51] Int. Cl.³ .............................................. H03K 5/24
[52] U.S. Cl. ................................... 307/491; 307/355; 307/530
[58] Field of Search ............... 307/350, 530, 355, 356, 307/359, 491, 494, 496, 497, 498; 328/162, 165, 167, 146, 147

[56] References Cited

U.S. PATENT DOCUMENTS 4,070,590 1/1978 Ieda et al. ........................... 307/530
4,139,911 2/1979 Sciulli et al. ........................ 307/530

Primary Examiner—John Zazworsky
Attorney, Agent, or Firm—Bruce C. Lutz; George A. Montanye; H. Fredrick Hamann

[57] ABSTRACT

The present comparator circuit uses a multiplexing operation in a feedback arrangement for balancing the current flow in one-half of a comparator circuit so that its effect is identical to the other half of the comparator circuit for a grounded input. In between the adjustment or "trim" operation, the same comparator and output circuitry are utilized to provide an indication of which of two input signals are greater. As designed, the circuit substantially eliminates unbalance problems due to temperature, device parameter variations due to processing, aging of these parameters and load unbalance conditions, as well as minimizing transistor noise in the output.

5 Claims, 6 Drawing Figures 4,494,019

LOW LEVEL SIGNAL COMPARATOR APPARATUS

THE INVENTION

The present invention is generally related to electronics and more specifically related to a circuit for comparing the relative values of two input signals and providing an output indicative of which of the two signals is greater in magnitude.

Although there are many types of comparator circuits, they have suffered from various deficiencies of aging, temperature drift and etc. which have affected their accuracy. Further, many prior art comparators did not have any feedback which may be used to continually update adjustments therein.

The present invention overcomes the prior art deficiencies by using one comparator circuit in two operating modes, one mode of which has a grounded control input for adjusting a balancing of current flow through that comparator section. The currents in two sections of the comparator are then compared in a flip-flop circuit (in a trim compare cycle). The output of the flip-flop converts the analog signal to a digital signal which is stored in a set/reset flip-flop and clocked into a sample and hold flip-flop and RC filter circuit to adjust the currents in one side of the comparator section toward a value such that the internal currents have identical effects during the "trim compare" time. Thus, in a few iterations of the trim cycle and compare cycle, the comparator circuit will be balanced and the input signal can be applied with assurance that the output signal will be accurately indicative of the relative magnitudes of the input signal. The multiplexing operation of the comparator in a trim mode intermingled with the compare mode results in circuit operation which is continually updated to minimize inaccuracies which result from aging, temperature induced deviations and load changes. Further, since the comparator detection circuit is turned to an OFF or "reset" condition just prior to each detection or decision operation, transistor noise does not have sufficient time to "build up" and thus, the noise contribution by the transistors is minimized.

In view of the above, it is an object of the present invention to provide improved comparator circuit apparatus.

Other objects and advantages of the present invention may be ascertained from a reading of the specification and appended claims in conjunction with the drawings, wherein:

DETAILED DESCRIPTION

Figure 1:
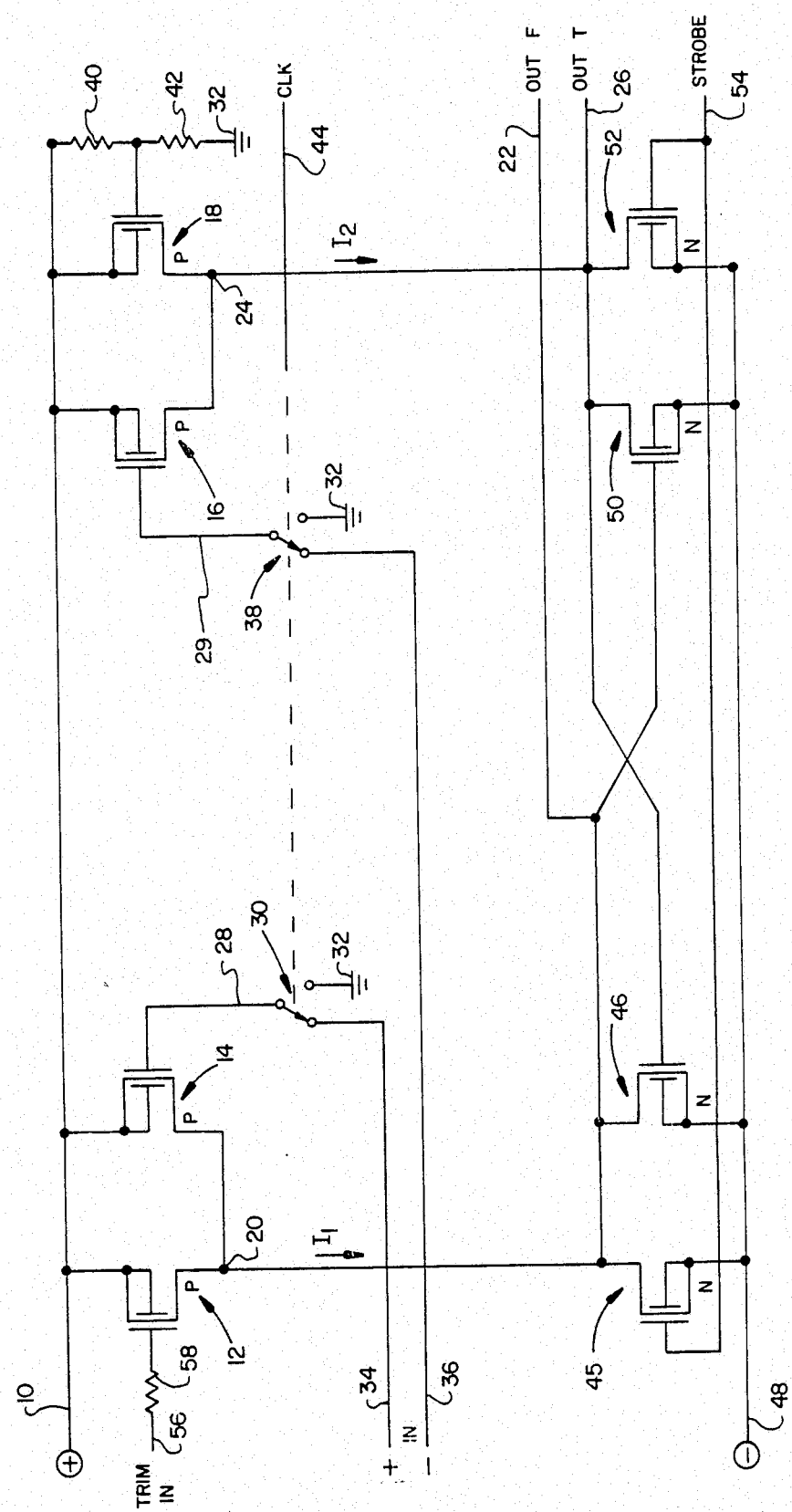
FIG. 1 is a detailed schematic diagram of the compare and detection portion of the concept.

In FIG. 1 a positive power terminal 10 is shown connected to the source lead of a plurality of P channel CMOS/SOS transistors or controlled impedances generally designated as 12, 14, 16, and 18. Each of these transistors has a body tie between the source lead and the extra gate (the body) inherent in CMOS FET's. The transistors 12 and 18 comprise balancing means operating in conjunction with the main comparator section transistors 14 and 16. The comparator section as a unit may also be termed voltage detection means, signal-to-current converter means, or voltage-to-current converter means. The drains of the transistors 12 and 14 are connected together and to a junction point 20 which is further connected to an output lead or node designated as 22 for providing "output false" information. The drains of transistors 16 and 18 are connected to a junction point 24 which is further connected to an output lead or node 26 which provides "output true" information. A gate of transistor 14 is connected to a lead 28 which is further connected to a movable contact of an electronically operated switch generally designated as 30 having one stationary contact connected to ground, reference potential or standard signal supplying means 32 and the other stationary contact connected to a lead or compared signal input 34 for providing input signals. A second lead or compared signal input 36 provides input signals to a stationary contact of a switch generally designated as 38 having its movable contact connected via lead 29 to the gate of transistor 16. The other stationary contact of switch 38 is connected to ground 32. A resistor 40 is connected between positive power terminal 10 and a gate of transistor 18. A further resistor 42 is connected between the gate of transistor 18 and ground 32. The resistors 40 and 42 set a $V_{ref}$ for FET 18 such that the contribution by transistor 18 to current $I_2$ is a pseudo fixed value. A clock lead 44 is shown with a dash line connection to the movable contacts of switches 30 and 38 and simultaneously operates each of these switches in accordance with a square wave clock signal illustrated in FIG. 2a.

Transistors 12 and 14 comprise a part of the comparator circuit for passing a current $I_1$ in the direction shown and may also be designated comparison voltage-to-current converters or detection means, while transistors 16 and 18 comprise another part of the comparator circuit for passing a current $I_2$ in the direction shown. A pair of N channel transistors or gate means generally designated as 45 and 46 are connected between junction point 20 and a negative power lead 48. Junction point 20 is also connected to a gate of an N channel transistor or gate means generally designated as transistor 50. Transistor 50 has drain and source leads connected between junction point 24 and negative power terminal 48. A further N channel transistor or gate means 52 is connected in parallel with transistor 50. The junction point 24 is also connected to the gate of transistor 46. A strobe input lead 54 is connected to the gates of transistors 45 and 52. The strobe signal is further illustrated in FIG. 2b. Output signals on leads 22 or 26 are shown in FIG. 2c. A final input in FIG. 1 is lead or trim input 56 which provides the trim input signal to provide a comparator balancing means. This signal on lead 56 results in transistor 12 being capable of injecting a current contribution to $I_1$ of zero to approximately twice that which is contributed by transistor 18 to $I_2$ for circuit balancing. A resistor 58 is connected between trim-in signal lead 56 and the gate of transistor 12. The impedance value of resistor 58 equals the parallel impedance value of resistors 40 and 42 for circuit balance. The cross coupled flip-flop comprising transistors 46 and 50 may also be termed a bi-state current amplitude detection means.

Figure 3:
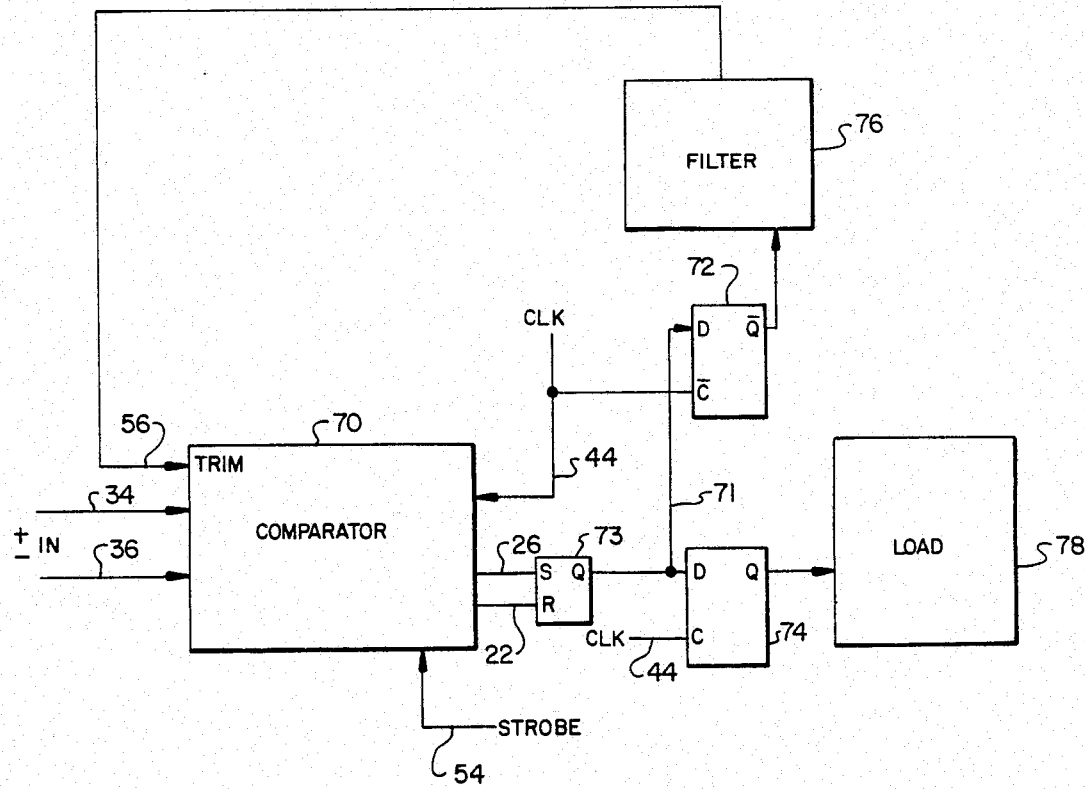
FIG. 3 is a block diagram illustrating the total concept including the circuit of FIG. 1.

In FIG. 3, the comparator of FIG. 1 is shown as block 70. The inputs and outputs which are utilized are given the same designation as in FIG. 1. In addition to the comparator 70, there is a set/reset flip-flop 73 connected to receive output signals on leads 22 and 26. There is a D flip-flop 72 connected to flip-flop 73 via a lead 71 . A further D flip-flop 74 also receives output signals on lead 71 from flip-flop 73. These two flip-flops 72 and 74 are slightly different in that one has clock signals applied to a C input whereas the other flip-flop has inputs applied to a $\overline{C}$ input. Flip-flop 72 has its $\overline{Q}$ output connected to a filter or block 76 whose output is connected via lead 56 to the trim input of comparator 70. Flip-flop 74 has its Q output connected to a load 78.

Figure 4:
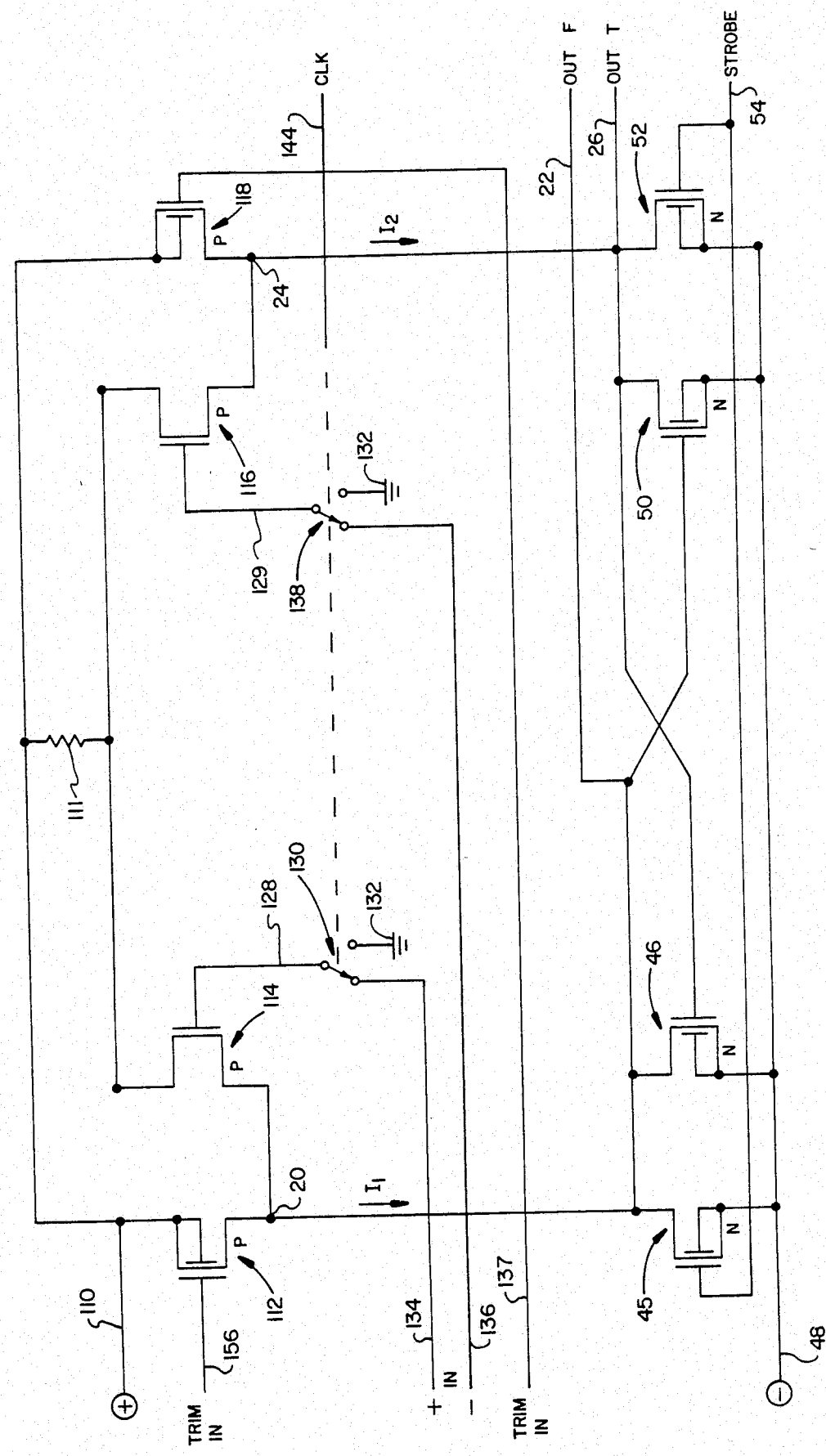
FIG. 4 is a detailed schematic diagram of a circuit similar to but different from FIG. 1.

FIG. 4 is similar to that of FIG. 1 and thus the lower portion uses the same designators. However, there are enough changes in the upper portion that new numbers are presented.

Power is supplied on an input 110 to transistors 112 and 118 and also through a resistor 111 to a transistor 114 and a further transistor 116. The drains of transistors 112 and 114 are tied together and the sum of the currents from these two transistors form current $I_1$ going to the drain of transistor 45. A switch generally designated as 130 receives signals on an input labeled 134 connected to a positive input terminal. A further terminal or node of switch 130 is connected to ground 132. The movable contact portion of switch 130 is connected to a lead 128 which is connected to the gate of transistor 114. A further switch 138 is connected via a lead 129 to the gate of transistor 116. A first contact of switch 138 is connected to ground 132 while a second switch contact is connected to a lead 136 which is connected to the minus signal input. A trim input lead 139 is connected to the gate of transistor 118. The drains of transistors 116 and 118 are connected to a node 24 which is connected to the drain of transistor 52. The total current through transistors 116 and 118 form the collective current $I_2$. A clock signal is input on a lead labeled clock and also designated as 144 and through a dash line connection operates the switches 130 and 138. Since the remaining circuitry uses the same numbers as in FIG. 1, these will not be further amplified upon.

Figure 5:
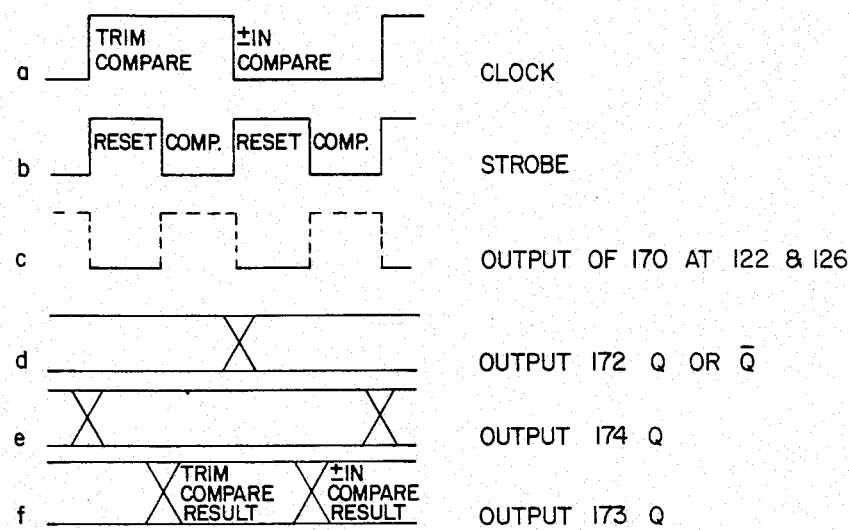
FIG. 5 is a set of waveforms used to illustrate the signals found in FIG. 4.

In FIG. 5 a first waveform 5a illustrates the clock signals supplied on clock lead 144. Waveform 5b illustrates the strobe signal supplied on lead 54 to FIG. 4. The waveform 5c illustrates the output of comparator 170 of FIG. 6 at leads 122 and 126. Waveform 5d illustrates the possible waveform at either of the outputs Q or $\overline{Q}$ for D flip-flop 172. The X indicates that the waveform at this point may be either rising or falling depending upon previous logic combinations. The waveform 5e illustrates two X's and are merely indicative of the time since the waveform may be either rising or falling at this time depending upon the logic conditions. Waveform 5f is drawn similarly and illustrates the trim compare or input compare result which is output from the Q output of R/S flip-flop 173.

Figure 6:
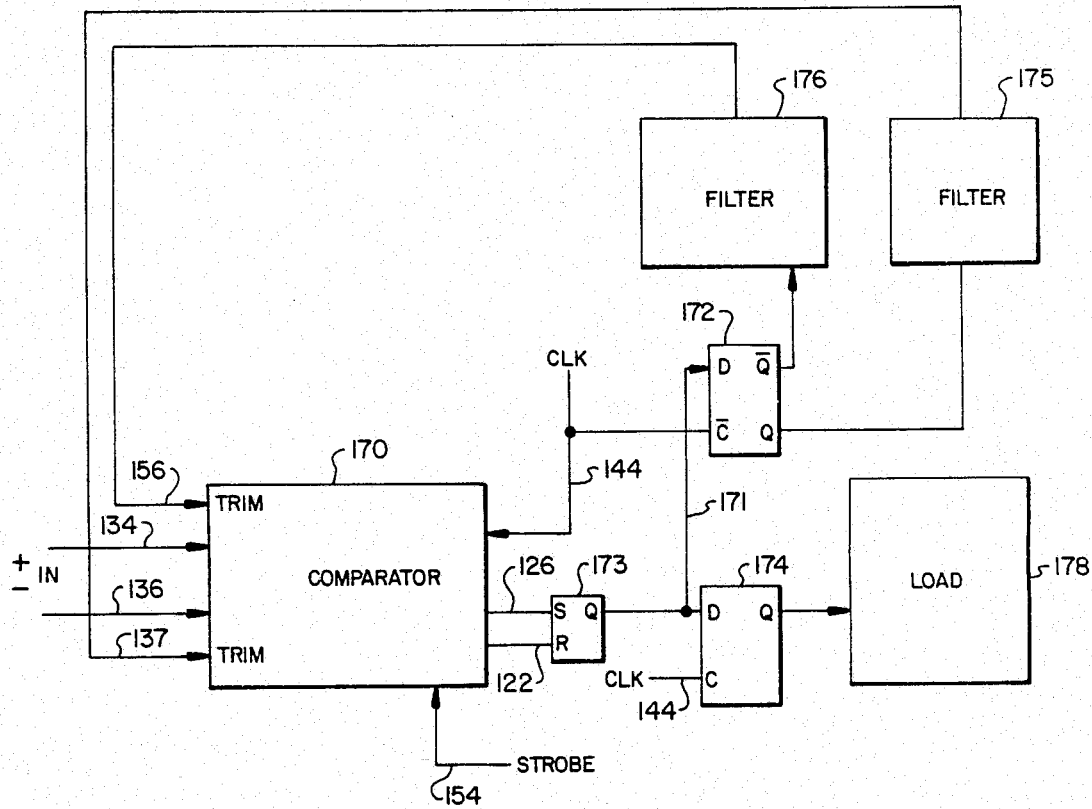
FIG. 6 is a block diagram of the concept using the circuit of FIG. 4.

In FIG. 6 the numbers utilized in FIG. 3 were used except that 100 was added to the previous designators. The only new designator is the filter 175 connected between the Q output of flip-flop 172 and a further trim input of comparator 170. This connection is provided by a lead 137.

OPERATION

Figure 2:
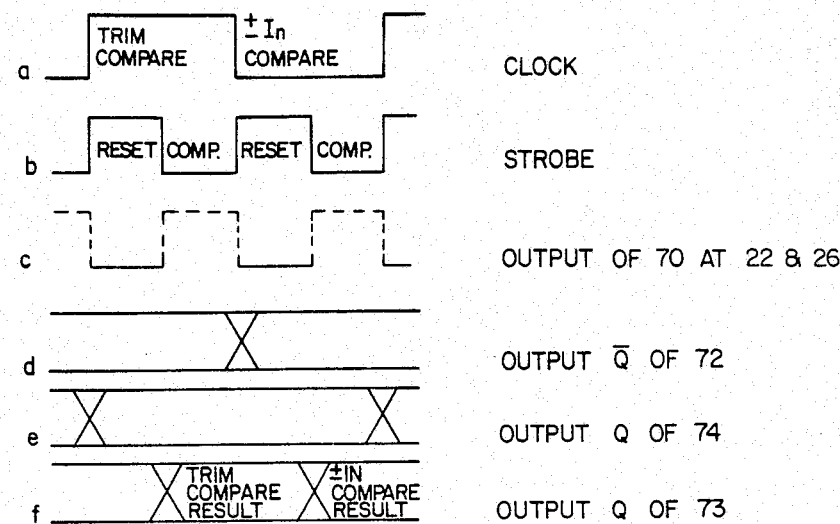
FIG. 2 is a set of waveforms used in explaining the operation of FIG. 1.

Reference will be first made to FIG. 3 in combination with FIG. 2. The comparator operates in two different modes, one is the trim compare mode and one is the +/− input compare mode. Thus, the comparator block 70 is multiplexed in operation with the trim modes interspersed or intermingled with the input compare modes. The purpose of the trim mode is to minimize or eliminate any errors due to various factors as mentioned previously in aging of components, mismatch of components, alterations in load values and noise pickup. The comparator 70 has two different input circuits and each of these compare a common value such as ground or some other reference potential. One of these input circuits will always be at least slightly different in its response to any signal including reference potential than the other. The results of such an unbalance are allowed to actuate an internal flip-flop during the compare portion of the trim mode cycle. This is the portion immediately after the reset mode as illustrated in waveform 2b. The output of block 70 is shown in FIG. 2c as being supplied to a set/reset flip-flop 73 which results in the temporary data storage of the comparator 70 output "comp." (see FIG. 2b) during the strobe 54 reset time. The output of flip-flop 73 is shown in waveform 2f. On the falling edge of the clock in waveform 2a, the flip-flop 73 data output is stored in flip-flop 72. The D flip-flop 72 acts as a sample and hold and thus holds the output illustrated in waveform 2d until the next trim mode compare clock transition. If there is no change in the signal on Q of flip-flop 73 at the next clock fall transition, the D flip-flop 72 does not change. Block 76 contains an RC filter whose output signal is the average value of the flip-flop 72 $\overline{Q}$ output. The D flip-flop 74, since it uses the C or clock input, operates to receive signals 73 Q on the D input during the +/− input compare mode time periods of the clock waveform rising transitions as shown in FIG. 2a. D flip-flop 74 is a sample and hold circuit and thus it maintains a given output until the input on the D input from 73 Q changes to a value different from the previous value during the compare portion of the +/− input compare mode.

Referring to the body ties of FIG. 1, it should be noted that although body ties are illustrated since they were used in one embodiment of the invention, the body ties are not required to practice the inventive concept.

For the first part of the discussion of FIG. 1, it will be assumed that the clock input on lead 44 is such that the switches 30 and 38 have their contacts connected to ground or reference potential 32. The strobe input on lead 54 will initially supply a logic "one" to the gate leads of transistors 45 and 52. This logic "one" turns these transistors to an ON condition and thus places the junction points 20 and 24 at approximately 0.2 volts. Thus, all the current $I_1$ from the transistors 12 and 14 pass through transistor 45 to minus potential or negative power lead 48 and all the current $I_2$ from the transistors 16 and 18 portion of the comparator section passes through transistor 52 to negative potential 48. Transistors 46 and 50 are turned OFF since their gate voltages or junction points 24 and 20, respectively, at 0.2 V is below or close to their gate-to-source threshold voltage levels.

At the end of the reset portion of the trim compare cycle, the input to transistors 45 and 52 will drop to a logic zero, thus turning these transistors to an OFF condition. As transistors 45 and 52 turn OFF, the currents $I_1$ and $I_2$ are integrated as a result of parasitic and transistor gate capacitances occurring at nodes 22 and 26 until transistors 46 and/or 50 gate-to-source threshold voltage is exceeded at which time regeneration of the cross-coupled transistors 46 and 50 comes into effect and results in the voltage levels at one of the nodes 20 or 24 going back to 0.2 V and the other node approaching the +voltage of node or positive power terminal 10. Thus, the currents $I_1$ and $I_2$ of the two comparator input sections will turn the flip-flops or gate means (46 and 50) to a condition whereby the output on leads 22 and 26 is indicative of which comparator input section believes it has the largest input signal. This signal is output as mentioned in conjunction with FIG. 3, filtered and fed back to the trim input 56 to adjust the current through the left-hand portion of the comparator to a new value of $I_1$ which will more nearly correspond to an identical effect current $I_2$ with regard to the operation of the cross-coupled flip-flop. In other words, $I_1$ and $I_2$ do not need to be identical but merely have identical effect when the feedback signal to trim input 56 produces a balanced condition. If any of the transistors or circuit imbalances are more sensitive to signal amplitude, this unbalanced effect will be compensated for in the trim feedback circuitry. This trim reset and trim compare must continue for several cycles after start-up before the currents $I_1$ and $I_2$ produce a changing logic level output on one of the leads for the trim mode compare cycle. In other words, when the system is balanced, the filtered signal at trim input lead 56 will go toward zero to turn transistor 12 ON and increase current $I_1$ during the trim mode compare cycle or move toward a logic "one" value to turn transistor 12 toward an OFF condition during the following trim mode compare cycles. The filter time constant is low enough that the comparator balancing means remains constant during the compare input cycle.

During the +/− input compare cycle, the strobe input signal on lead 54 again resets transistors 45 and 52 to initialize the system. During the compare mode portion of the +/− input compare cycle, the currents $I_1$ and $I_2$ (with the transistors 12 and 18 contribution being pseudo constant) will now be different due to transistors 14 and 16 having inputs 34 and 36 which are not equal and the current integration on nodes 22 and 26 capacitance to finally generate voltages on these nodes to again increase until one of transistors 46 and 50 changes to an ON condition similar to the operation defined above in the trim cycle thereby actuating a given relay or other voltage sensing load circuit such as flip-flop 73 of FIG. 3 and passed on to flip-flop 74 to drive a load 78.

As it is known, transistor noise can make a contribution to a minimum signal level that can be detected by sensitive comparator circuitry. However, the present design places the comparator in the reset condition immediately prior to detection, thus the possible erroneous noise signal contribution is minimized.

The circuitry shown in FIGS. 4 through 6 is very similar to that discussed above except for the inventive concept operating at a slightly lower internal speed but has a higher gain and is not as sensitive to variations in specifications of the various parts. In this circuit the signals input on leads 137 and 156 are differential in nature. The elimination of the biasing resistors for transistor 118 balances the parasitic capacitances at nodes 20 and 24 whereby a circuit balance is easier to obtain. With this design, the trim signals appearing on leads 137 and 156 have greater effect on the balancing act for the currents $I_1$ and $I_2$.

Along with the above changes, transistors 114 and 116 are one-fourth the size of the comparable transistors in the original design. By reducing the size of these transistors and making various other technical changes in the mechanical and electrical design of the circuit, spike voltage and current transients have been reduced in the version shown in FIG. 4 as compared to that of FIG. 1. Since transistors 114 and 116 operate in a differential amplifier mode, any increase or decrease in the current $I_1$ will cause a similar but opposite effect on current $I_2$. This action even further increases the gain effects of voltage differences of signals applied at inputs 134 and 136. Such action also helps increase the gain in the trim adjust cycle.

The circuit of FIG. 6 is very similar to that of FIG. 3 except that the additional filter 175 has been added and both of these filters are usable as capacitor filters only rather than the resistor-capacitor filter previously used due to changed source impedances at the outputs of flip-flop 172, etc.

From an operational comments point of view, it may be noted that since the flip-flop 172 has a $\overline{C}$ input, it is clocked on the negative edge of the clock whereas the C input of D flip-flop 174 is clocked on the positive edge since the clock input on lead 144 is applied to the C input. However, the two outputs Q and $\overline{Q}$ bar of D flip-flop 172 are identical and merely opposite in phase and thus would filter substantially identically through their respective filters.

In view of the substantial identity of FIG. 6 with FIG. 3, it is believed that further operational comments are unnecessary.

In summary, the present invention uses a multiplexing operation wherein the comparator circuitry uses a reference potential such as ground to supply signals to a feedback loop which adjusts the comparator circuit to a near identical balance of the 46 and 50 transistor flip-flop action. With the transistor 46 and 50 flip-flop action balanced, the apparatus is then used to determine, in the +/− input compare mode, which of two input signals being measured is largest.

While the present invention is illustrated using block diagrams and CMOS/SOS transistors in a digital circuitry layout, I wish to be limited not by the specific circuit illustrated but only by the scope of the appended claims:

I claim:

1. The method of compensating comparator apparatus imbalances comprising the steps of:
   periodically detecting the current amplitude of a first analog input signal as compared to the current amplitude of a second analog input signal;
   outputting one of two logic values as a feedback signal indicative of which of said first and second analog input signals is larger;
   periodically adjusting the current flow through one of first and second grounded input voltage detection devices toward identical values as a function of said feedback signal;
   comparing input signals between the periodic adjustments of the input voltage detection devices; and
   outputting a result signal indicative of the comparison of input signals between said periodic adjustments.

2. Apparatus for compensating for comparator imbalances comprising, in combination:
   first and second analog input signal supplying means;
   bi-state current amplitude detection means including first and second inputs, output means and control means, said bi-state detection means providing output signals as detected on a periodic basis in accordance with signal supplied to said control means thereof, the value of the logic signal appearing at said output means thereof being indicative of the relative current amplitude of signals supplied to said first and second inputs thereof;

ground means;

voltage detection means including control input means, voltage input means and current output means, said voltage detection means including current bypass means for adjusting current at said output menas thereof in accordance with signals supplied to said control means, a predetermined proportion of the current at said current output means thereof being indicative of given signals supplied to said voltage input means;

switch means connected between said first and second voltage input means of said voltage detection means and said ground means and said first and second analog input signal supplying means for periodically connecting said first and second voltage input means to said ground potential and allowing analog signal inputs to said voltage detection means intermediate the periodical ground connections, the output signal at said output means for said bi-state current detection means being indicative of the comparison of input signals occurring between feedback adjustments resulting from ground potential indicative conditions; and feedback means connected between said output means of said bi-state detection means and said control input of said voltage detection means for adjusting total signal received at each of said inputs of said bi-state means from said voltage detection means to predetermined relative values during ground connection conditions of said switch means.

3. Comparator circuit compensation apparatus comprising, in combinatin:

first and second input signal to current converter means each including signal input means, control input means and current output means;

reference signal input means connected to said control input means of said first current converter means;

standard signal supplying means;

first and second compared signal input means;

clock signal means for supplying clock signals having trim and compare logic values;

first switch means connected to said signal input means of said first converter means, said standard signal supplying means, said first compared signal input means and said clock signal means for applying first compared input signals to said first converter means during clock compare logic value signals and for applying standard signals to said first converter means during clock trim logic value signals;

second switch means connected to said signal input means of said second converter means, said standard signal means, said second compared signal input means and said clock signal means for applying second compared input signals to said second converter means during clock compare logic value signals and for applying standard signals to said second converter means during clock trim logic value signals; and detection means, including feedback means connected to said control input means of said second converter means, connected to said current output means of each of said converter means for supplying trim compare feedback signals to said control input means of said second current converter means during clock trim logic value signals indicative of the relative values of current received from said current output means of said first and second converter means, said detection means supplying compare output signals during clock compare logic value signals.

4. Apparatus as claimed in claim 3 wherein said detection means comprises, in combination:

flip-flop means for receiving input current signals and reacting in accordance with the relative values of said input current signals;

reset means connected to said flip-flop means for initializing said flip-flop means at the beginning of each trim and compare clock logic value; and signal storage means for sampling and holding the value of the feedback signal until the next clock trim logic value.

5. The method of compensating a signal amplitude comparator having two voltage-to-current converters and current signal detection means comprising, the steps of:

establishing a periodically recurring trim cycle for, first grounding the inputs of two voltage-to-current converters, second supplying adjustable compensatory current signals as supplements to the outputs of said two voltage-to-current converters, third detecting the largest of the two current signals, including compensatory current signals, received from said two voltage-to-current converters, and fourth outputting a feedback signal to adjust the relative amplitude of said compensatory current signals toward values which are identical as perceived by the detection means; and establishing periodically recurring compare cycles intermediate said recurring trim cycles wherein the inputs of said voltage-to-current converters are supplied with signals to be compared and the output of the current signal detection means is supplied to a load rather than used as a feedback signal.

* * * * *